(12) United States Patent
Yen et al.

(10) Patent No.: US 9,159,718 B2
(45) Date of Patent: *Oct. 13, 2015

(54) SWITCHED CAPACITOR STRUCTURE

(71) Applicant: Taiwan Semiconductor Manufacturing Co., Ltd., Hsin-Chu (TW)

(72) Inventors: Hsiao-Tsung Yen, Tainan (TW); Ying-Ta Lu, Fanlu Township (TW); Ho-Hsiang Chen, Hsinchu (TW); Chewn-Pu Jou, Chutung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 52 days.

This patent is subject to a terminal disclaimer.

(21) Appl. No.: 13/789,825

(22) Filed: Mar. 8, 2013

(65) Prior Publication Data
US 2014/0252546 A1     Sep. 11, 2014

(51) Int. Cl.
*H01L 21/02* (2006.01)
*H01L 27/02* (2006.01)
*H01L 23/522* (2006.01)

(52) U.S. Cl.
CPC ........ *H01L 27/0207* (2013.01); *H01L 23/5223* (2013.01); *H01L 2924/0002* (2013.01)

(58) Field of Classification Search
CPC ............ H01L 23/5223; H01L 27/0207; H01L 2924/0002; H01L 2924/00; H01L 27/0214; H01L 27/0805; H01L 28/82
USPC ......... 257/532, 309, 306, 415, 312, 418, 296; 438/689, 52, 253, 240; 361/3, 305, 361/328; 73/514.32, 780, 314.32
See application file for complete search history.

(56) References Cited

U.S. PATENT DOCUMENTS

| | | | |
|---|---|---|---|
| 5,583,359 A * | 12/1996 | Ng et al. | 257/306 |
| 5,978,206 A | 11/1999 | Nishimura et al. | |
| 6,066,537 A * | 5/2000 | Poh | 438/393 |
| 6,121,107 A | 9/2000 | Chang | |
| 6,743,671 B2 | 6/2004 | Hu et al. | |
| 6,765,778 B1 | 7/2004 | Du et al. | |
| 6,784,050 B1 | 8/2004 | Aram et al. | |
| 7,072,169 B2 * | 7/2006 | Hayashi et al. | 361/306.3 |
| 7,102,557 B1 | 9/2006 | Frith | |
| 7,335,956 B2 | 2/2008 | Chen et al. | |
| 8,198,937 B1 | 6/2012 | Vilas Boas et al. | |
| 8,759,893 B2 * | 6/2014 | Cho | 257/308 |
| 2003/0063026 A1 | 4/2003 | Nandy | |
| 2003/0089941 A1 * | 5/2003 | Baker et al. | 257/309 |

(Continued)

*Primary Examiner* — Fernando L Toledo
*Assistant Examiner* — Mohammed Shamsuzzaman
(74) *Attorney, Agent, or Firm* — Duane Morris LLP

(57) ABSTRACT

A capacitor structure comprising semiconductor substrate and a matrix of capacitor units formed over the semiconductor substrate each capacitor unit. The matrix includes an interior structure comprised of one or more vertical plates, each vertical plate of the interior structure formed from a plurality of conductive portions connected vertically to each other, an exterior structure comprised of one or more vertical plates, each vertical plate of the exterior structure formed from a plurality of conductive portions connected vertically to each other, the exterior structure substantially encompassing the interior structure, and insulative material separating the interior and exterior structures. The structure also comprises a switching mechanism included in the capacitor structure to switch between ones of the plural capacitor units.

9 Claims, 6 Drawing Sheets

(56) References Cited

U.S. PATENT DOCUMENTS

2003/0183008 A1* 10/2003 Bang et al. ............... 73/514.01
2003/0218473 A1* 11/2003 Yamashita et al. ............ 324/765
2008/0094149 A1* 4/2008 Brobston .................... 333/17.3
2009/0067116 A1* 3/2009 Fujii et al. ................... 361/303
2009/0101622 A1* 4/2009 Wang et al. .................... 216/13
2009/0230509 A1 9/2009 MacIntosh et al.
2010/0148304 A1* 6/2010 Rahim et al. .................. 257/532
2010/0271753 A1* 10/2010 Wang et al. ................... 361/305
2014/0167992 A1* 6/2014 Aruga .......................... 341/143

* cited by examiner

SWITCHED CAPACITOR STRUCTURE

RELATED APPLICATIONS

The present disclosure is related to commonly-assigned U.S. patent application Ser. No. 13/411,052 filed Mar. 2, 2012 and entitled, "Structure and Method for a Fishbone Differential Capacitor," the entire disclosure of which is incorporated herein by reference. The present disclosure is also related to commonly-assigned U.S. patent application Ser. No. 13/902,392 filed May 24, 2013 and entitled, "A High Resolution and Process Limitation-Free Switched Capacitance Method and Apparatus," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. These advances, however, have increased the complexity of processing and manufacturing ICs and, for these advances to be realized, similar developments in IC processing and manufacturing are needed.

Various active and/or passive electronic components can be formed on a semiconductor IC. Capacitors are essential components for many ICs, such as sample-and-hold circuits, analog-to-digital (A/D) circuits, digital-to-analog (D/A) circuits and resonant circuits, switched-capacitor and continuous-time filters, as well as to many radio frequency (RF) applications. Capacitors are extensively used for many logic and other applications in the semiconductor manufacturing industry and are integrated into various types of semiconductor devices. Due to higher integration requirements to minimize costs associated with IC fabrication processes, the semiconductor manufacturing industry strives toward economization of each process step and minimization of chip size, while maximizing quality and functionality to the extent possible. Due to these trends of miniaturization or scaling of ICs to provide smaller ICs and improved performance, capacitor designs that consume low areas and possess high capacitance density are highly desirable.

Analog ICs generally employ various types of integrated capacitors utilizing metal-oxide-semiconductors (MOS) including p-n junction capacitors, metal-insulator-metal (MIM) capacitors, poly-to-poly capacitors, metal-oxide-metal (MOM) capacitors, and other structures. MOM capacitors, also known as vertical parallel plate (VPP) capacitors, can include natural vertical capacitors (NVCAPs), lateral flux capacitors, comb capacitors, interdigitated finger capacitors, etc. and are one of the most widely used MOS capacitors due to respective characteristics, e.g., high capacitance density, low parasitic capacitance, symmetric design, superior RF characteristics, good matching characteristics, and processing advantages.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

DETAILED DESCRIPTION

Figure 1:
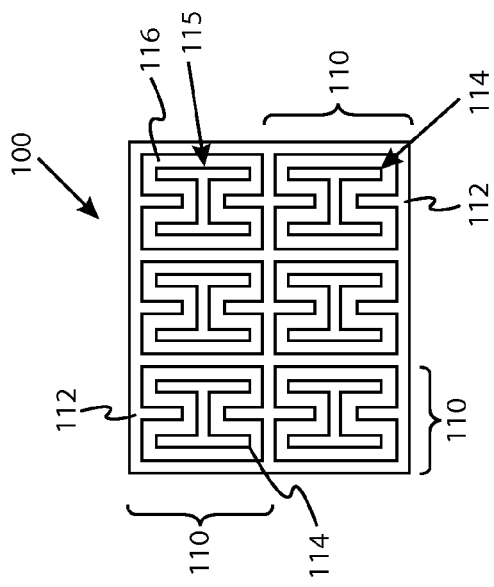
FIG. 1 is a top view of an integrated capacitor structure according to some embodiments of the present disclosure.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. Moreover, space orientation terms such as "under", "on", "up", "down", etc. are used to describe a relationship between a device or a characteristic and another device or another characteristic in the drawing. It should be noted that the space orientation term can cover different orientations of the device besides the orientation of the device illustrated in the drawing. For example, if the device in the drawing is turned over, the device located "under" or "below" the other devices or characteristics is reoriented to be located "above" the other devices or characteristics. Therefore, the space orientation term "under" may include two orientations of "above" and "below".

Embodiments of the present disclosure are applicable to various types of integrated capacitors utilizing metal-oxide-semiconductors (MOS) including, but not limited to, p-n junction capacitors, metal-insulator-metal (MIM) capacitors, poly-to-poly capacitors, metal-oxide-metal (MOM) capacitors, and combinations thereof. Exemplary MOM or vertical parallel plate (VPP) capacitors, include but are not limited to, natural vertical capacitors (NVCAPs), lateral flux capacitors, comb capacitors, interdigitated finger capacitors, etc. Exemplary capacitors according to embodiments of the present disclosure provide high capacitance density, low parasitic capacitance, symmetric design, superior RF characteristics, good matching characteristics, and superior processing advantages over conventional capacitors.

Exemplary capacitors according to embodiments of the present disclosure can exploit the effect of intralayer capacitive coupling between plates formed by standard metallization wiring lines and/or vias. Lateral capacitive coupling can provide better matching characteristics than vertical coupling due to a better process control of lateral dimensions than that of metal and dielectric layer thicknesses. To increase the capacitance density (capacitance per unit area of silicon chip), several metal layers can be connected in parallel by vias, forming a vertical metal wall or mesh. Normally, the lowest metal layers (e.g., M1-M5 layers) having a minimum metal line width and spacing can be used for exemplary capacitors to maximize capacitance density.

Figure 2A:
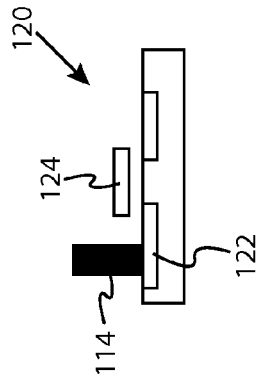
FIG. 2A is a vertical cross section of a switch for the integrated capacitor structure of FIG. 1.
Figure 2B:
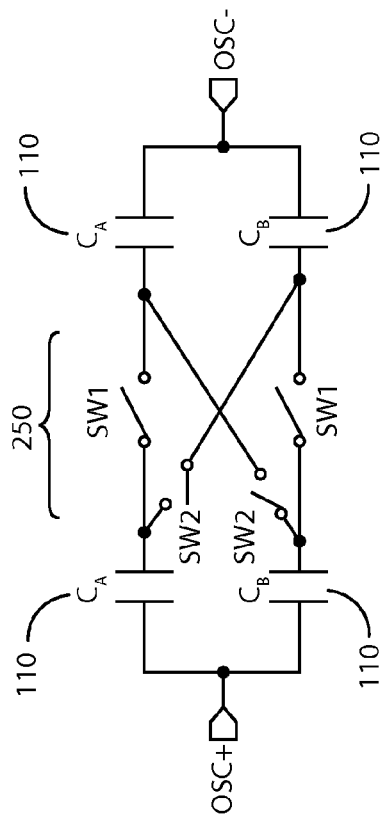
FIG. 2B is a schematic diagram for an exemplary switch.

FIG. 1 is a top view or cross section of an integrated capacitor structure according to some embodiments of the present disclosure. FIG. 2A is a vertical cross section of a switch for the integrated capacitor structure of FIG. 1, and FIG. 2B is a schematic diagram for an exemplary switch. With reference to FIGS. 1, 2A and 2B, an integrated capacitor structure 100 includes a matrix of integrated capacitor units 110, each of which comprises an outer vertical metal plate(s) 112 and an inner vertical metal plate(s) 114. In the non-limiting configuration illustrated in FIG. 1, the inner vertical metal plate(s) 114 forms an H-shaped structure 115 with outer vertical metal plate(s) 112 enveloping each structure 115 and separating adjacent units 110 and adjacent, parallel inner vertical metal plates 114 within the H-shaped structure 115. In some embodiments, the interior structures in the capacitor units 110 can possess other suitable geometries. Further, in some embodiments of the present disclosure, an integrated capacitor structure 100 has different or varying interior structures for any number of capacitor units 110 within an exemplary integrated capacitor structure 100. It should also be noted that the number of integrated capacitor units 110 in the illustrated structure 100 is only exemplary as embodiments according to the present disclosure can include more or less than the six integrated capacitor units 110 depicted.

The outer vertical metal plates 112 can be insulated from adjacent inner vertical metal plates 114 using an insulation material 116 such as, but not limited to, interlayer dielectrics or other suitable insulators employed in semiconductor fabrication processes. The outer and inner vertical metal plates 112, 114 can be formed on a semiconductor substrate (not shown) and can be formed from several metal layers connected in parallel by vias, or otherwise, to thereby form a vertical metal wall or mesh. The outer vertical metal plate 112 can be electrically connected to a signal line (not shown), and the inner vertical metal plate(s) 114 can be electrically connected to a ground node 122 in a switch 120 depicted in FIG. 2A. Exemplary switches 120 can comprise one or more grounding nodes 122 and/or gate nodes 124 whereby each interior structure 115 is connected to one switch 120. Exemplary switches 120 can be, but are not limited to, a metal-oxide-semiconductor field effect transistor (MOSFET), a diode, a bipolar junction transistor (BJT), a PN transistor, an NP transistor, an NPN transistor, a PNP transistor, or other switching mechanism. In some embodiments of the present disclosure, an exemplary integrated capacitor structure 100 can comprise a plurality of different switches for the respective units 110 within the integrated capacitor structure 100. Further, any or all of the capacitor units 110 can be independently tuned by a respective switch 120.

For example, various embodiments of the present disclosure can provide an exemplary high resolution and low area switched capacitance technique and system to switch between capacitor units 110 within a structure 100. One such technique is illustrated in FIG. 2B where appropriate switching mechanisms 250 or sets thereof, e.g., diode, transistor, etc. are utilized to switch between one or more sets or banks of capacitors or capacitor units within a structure. Such an exemplary switching mechanism can be employed to change capacitance thereby affecting oscillation frequency in a respective device. Additional discussion regarding this and other exemplary, non-limiting switching mechanisms are provided in commonly-assigned U.S. patent application Ser. No. 13/902,392 filed May 24, 2013 and entitled, "A High Resolution and Process Limitation-Free Switched Capacitance Method and Apparatus," the entire disclosure of which is incorporated herein by reference. Thus, an exemplary structure 100 can provide a wide range of capacitance for various applications. As the sides of each of the integrated capacitor units 110 are facing substantially similar environments, the integrated capacitor structure 100 provides exemplary matching characteristics and there is no need to provide dummy metals that typically surround conventional capacitor units.

Figure 4:
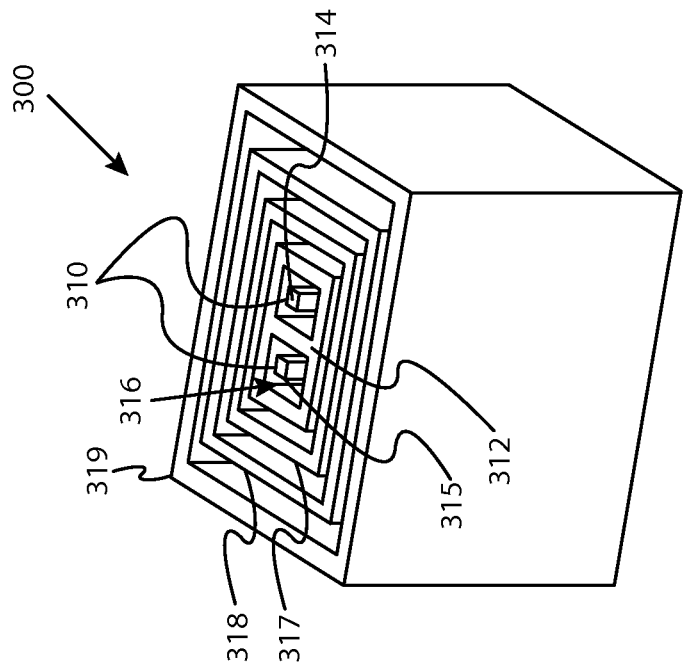
FIG. 4 is a perspective view integrated capacitor structure of FIG. 3.
Figure 3:
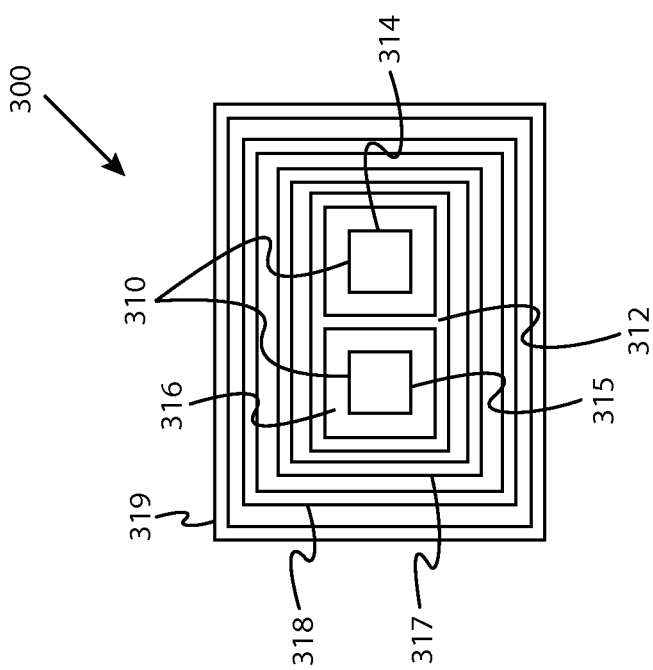
FIG. 3 is a top view of an integrated capacitor structure according to other embodiments of the present disclosure.

FIG. 3 is a top view or cross section of an integrated capacitor structure according to other embodiments of the present disclosure. FIG. 4 is a perspective view of the integrated capacitor structure of FIG. 3. With reference to FIGS. 3 and 4, an integrated capacitor structure 300 includes two interior integrated capacitor units 310, each of which comprises an outer vertical metal plate(s) 312 and an inner vertical metal plate(s) 314 or post. Vertical metal plates (s) 312 may also comprise metal layer(s) and via(s) inbetween. In the non-limiting embodiment illustrated in FIG. 3, the inner vertical metal plate(s) 314 forms a post-like structure 315 with outer vertical metal plate(s) 312 enveloping each structure 315 and separating adjacent units 310. Of course, the interior structures in the capacitor units 310 can possess other geometries in some embodiments. Further, some embodiments of the present disclosure can provide an integrated capacitor structure 300 having different or varying interior structures for any number of capacitor units 310, and it should also be noted that the number of integrated capacitor units 310 within the illustrated structure 300 is only exemplary as embodiments according to the present disclosure can include more or less than the two integrated capacitor units 310 depicted. As illustrated in FIGS. 3 and 4, additional plates 317, 318, 319 can be concentrically provided in coils for an exemplary integrated capacitor structure 300.

Adjacent vertical metal plates 312, 314, 317, 318, 319 can be insulated from each other using an insulation material 316 such as, but not limited to, interlayer dielectrics or other suitable insulators employed in semiconductor fabrication processes. These metal plates can be formed on a semiconductor substrate (not shown) and can be formed from several metal layers connected in parallel by vias, or otherwise, to thereby form a vertical metal wall or mesh. The outer vertical metal plate 312 and additional plate(s) 318 can be electrically connected to a signal line (not shown), and the inner vertical metal plate(s) 314 and additional plates 317, 319 can be electrically connected to a ground node in an exemplary switch described above. Exemplary switches can be, but are not limited to, a MOSFET, a diode, a BJT, a PN transistor, an NP transistor, an NPN transistor, a PNP transistor, or other switching mechanism. In some embodiments of the present disclosure, an exemplary integrated capacitor structure 300 can comprise a plurality of different switches for the respective units 310 within the integrated capacitor structure 300. Further, any or all of the capacitor units 310 can be independently tuned by a respective switch. Thus, an exemplary structure 300 can provide a wide range of capacitance for various applications. For example, in some embodiments of the present disclosure an inner structure or coil can possess a capacitance of 1 fF with concentric coils or structures possessing capacitances of 2 fF, 4 fF, 8 fF, etc. Thus, some embodiments can utilize the structure depicted in FIGS. 3 and 4 to provide a varactor-like capacitor.

Figure 6:
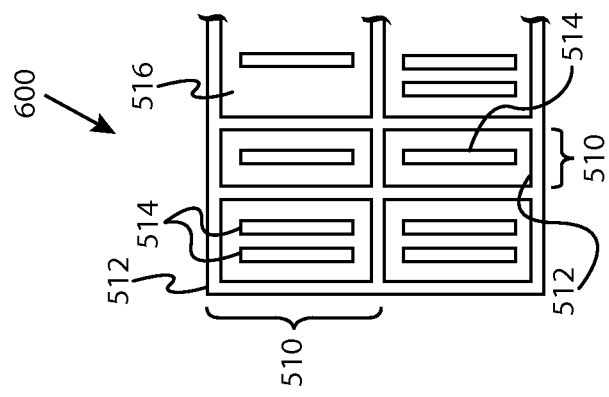
FIGS. 5-10 provide top views of various integrated capacitor structures according to embodiments of the present disclosure.
Figure 5:
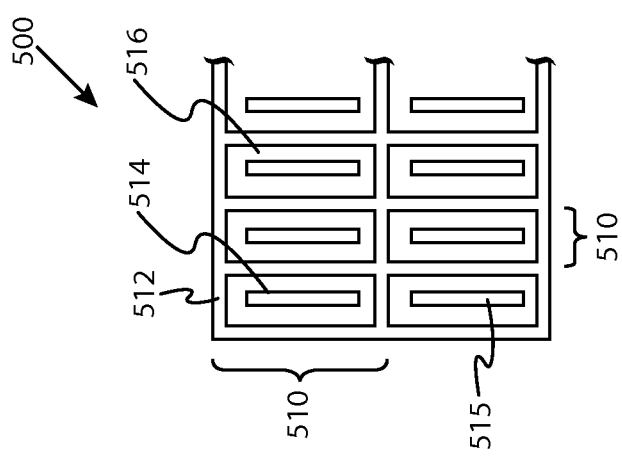

FIGS. 5-10 provide top views or cross sections of various integrated capacitor structures according to additional embodiments of the present disclosure. With reference to FIGS. 5 and 6, integrated capacitor structures 500, 600 can include a matrix of integrated capacitor units 510, each of which comprises an outer vertical metal plate(s) 512 and an inner vertical metal plate(s) 514. In the non-limiting configuration illustrated in FIG. 5, the inner vertical metal plate(s) 514 forms an I-shaped structure 515 with outer vertical metal plate(s) 512 enveloping each structure 515 and separating adjacent units 510 and adjacent, parallel inner vertical metal plates 514 within the I-shaped structure 515. The interior structures 515 in the capacitor units 510 can possess other geometries in some embodiments. In the non-limiting configuration illustrated in FIG. 6, the inner vertical metal plate(s) 514 forms one or more I-shaped structures 515 with the outer vertical metal plate 512 enveloping each structure(s) 515 and separating adjacent units 510. As illustrated, some units 510 can include a plurality of inner vertical metal plates 514. It should be also noted that the number of integrated capacitor units 510 in the illustrated structures 500, 600 is only exemplary as embodiments according to the present disclosure can include more or less than the eight integrated capacitor units 510 depicted. The outer vertical metal plates 512 can be insulated from adjacent inner vertical metal plates 514 using an insulation material 516 such as, but not limited to, interlayer dielectrics or other suitable insulators employed in semiconductor fabrication processes. The outer and inner vertical metal plates 512, 514 can be formed on a semiconductor substrate (not shown) and can be formed from several metal layers connected in parallel by vias, or otherwise, to thereby form a vertical metal wall or mesh. The outer vertical metal plate 512 can be electrically connected to a signal line (not shown), and the inner vertical metal plate(s) 514 can be electrically connected to a ground node in an exemplary switch described above. In some embodiments, if the switch is "ON", the inner vertical plate(s) 514 is connected to the ground. Conversely, in some embodiments if the switch is "OFF", the inner vertical plates are floating which provides a minor parasitic between the outer and inner vertical metal plates 512, 514. In additional embodiments of the disclosure, each different section of the inner metal plate 514 can be connected to the same or to different switches to control capacitance of the respective device based on the design specifications therefor. Exemplary switches can be, but are not limited to, a MOSFET, a diode, a BJT, a PN transistor, an NP transistor, an NPN transistor, a PNP transistor, or other switching mechanism. In some embodiments of the present disclosure, exemplary integrated capacitor structures 500, 600 can comprise a plurality of different switches for the respective units 510 within the integrated capacitor structures 500, 600. Further, any or all of the capacitor units 510 can be independently tuned by a respective switch. Thus, exemplary structures 500, 600 can provide a wide range of capacitance for various applications.

Figure 8:
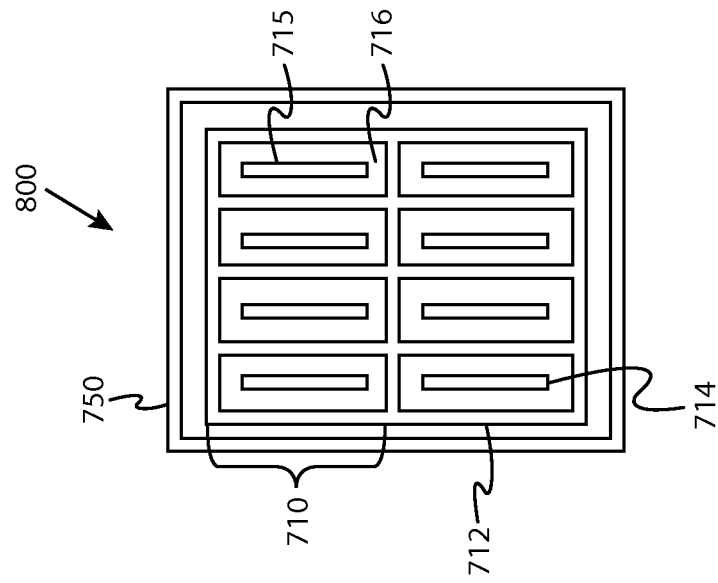
Figure 7:
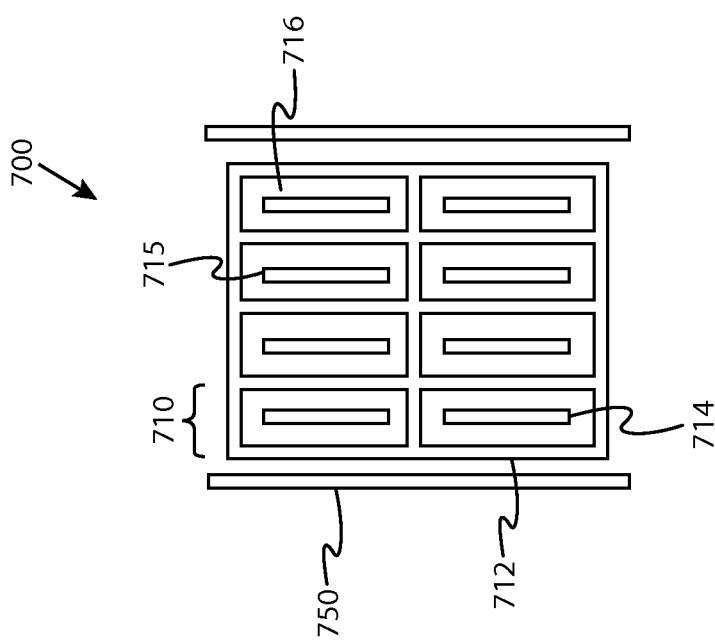

With reference to FIGS. 7 and 8, integrated capacitor structures 700, 800 include a matrix of integrated capacitor units 710, each of which comprises an outer vertical metal plate(s) 712 and an inner vertical metal plate(s) 714. In the non-limiting configurations illustrated in FIGS. 7 and 8, the inner vertical metal plate(s) 714 form an I-shaped structure 715 with the outer vertical metal plate 712 enveloping each structure 715 and separating adjacent units 710 and adjacent, parallel inner vertical metal plates 714 within the I-shaped structure 715. The capacitor units 710 can possess other suitable geometries in some embodiments. It should be also noted that the number of integrated capacitor units 710 in the illustrated structures 700, 800 is only exemplary as embodiments according to the present disclosure can include more or less than the eight integrated capacitor units 710 depicted. In the depicted configurations, additional vertical metal plates 750 can envelope the capacitor structure 800 (FIG. 8) or partially enclose the capacitor structure 700 (FIG. 7). Additional concentric plates (not shown) or coils can also be employed to provide structures having varying and tunable capacitances such as the concentric plates illustrated in FIGS. 3 and 4. The outer vertical metal plate(s) 712 can be insulated from adjacent inner vertical metal plates 714 and/or additional plates 750 using an insulation material 716 such as, but not limited to, interlayer dielectrics or other suitable insulators employed in semiconductor fabrication processes. The vertical metal plates 712, 714, 750 can be formed on a semiconductor substrate (not shown) and can be formed from several metal layers connected in parallel by vias, or otherwise, to thereby form a vertical metal wall or mesh. The outer vertical metal plate(s) 712 and/or any additional plates, as applicable, can be electrically connected to a signal line (not shown), and the inner vertical metal plate(s) 714 and/or additional plates 750 can be electrically connected to a ground node in an exemplary switch described above. Exemplary switches can be, but are not limited to, a MOSFET, a diode, a BJT, a PN transistor, an NP transistor, an NPN transistor, a PNP transistor, or other switching mechanism. In some embodiments of the present disclosure, exemplary integrated capacitor structures 700, 800 can comprise a plurality of different switches for the respective units 710 within the integrated capacitor structures 700, 800. Further, any or all of the capacitor units 710 can be independently tuned by a respective switch. Thus, exemplary structures 700, 800 can provide a wide range of capacitance for various applications.

Figure 9:
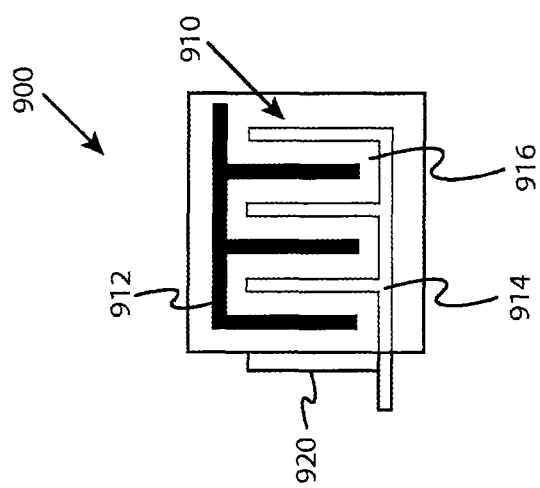

With reference to FIG. 9, an integrated capacitor structure 900 includes an interdigitated finger matrix 910 having a first set 912 of finger structures including vertical metal plates and a second set 914 of finger structures also including vertical metal plates. It should be also noted that the number of interdigitated fingers in the illustrated structure 900 is only exemplary as embodiments according to the present disclosure can include more or less than the three digits depicted. The first and second sets 912, 914 of finger structures can be insulated from each other and adjacent digits in the same set using an insulation material 916 such as, but not limited to, interlayer dielectrics or other insulators employed in semiconductor fabrication processes. The first and second sets 912, 914 can be formed on a semiconductor substrate (not shown) and can be formed from several metal layers connected in parallel by vias, or otherwise, to thereby form a vertical metal wall or mesh. One of the two sets of finger structures 912 or 914 can be electrically connected to a signal line (not shown), and the other set of finger structures 914 or 912 can be electrically connected to a ground node in an exemplary switch 920 described above. Exemplary switches can be, but are not limited to, a MOSFET, a diode, a BJT, a PN transistor, an NP transistor, an NPN transistor, a PNP transistor, or other switching mechanism. In some embodiments of the present disclosure, the structure 900 can be a MOM capacitor.

Figure 10:
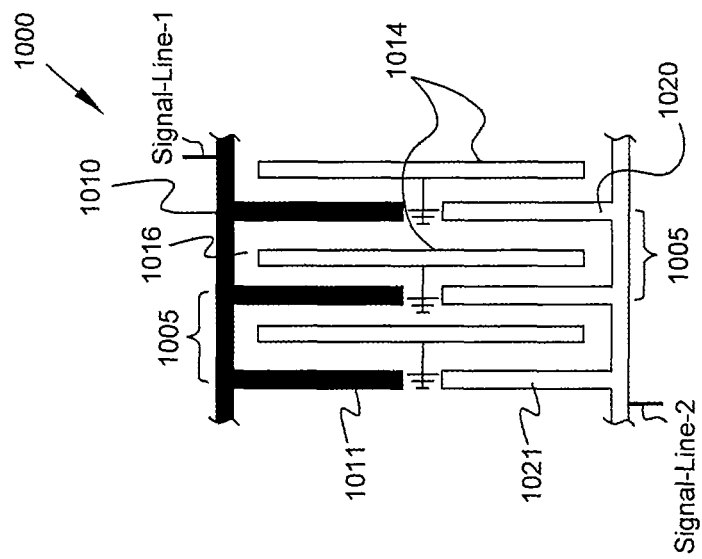
Figure 10A:
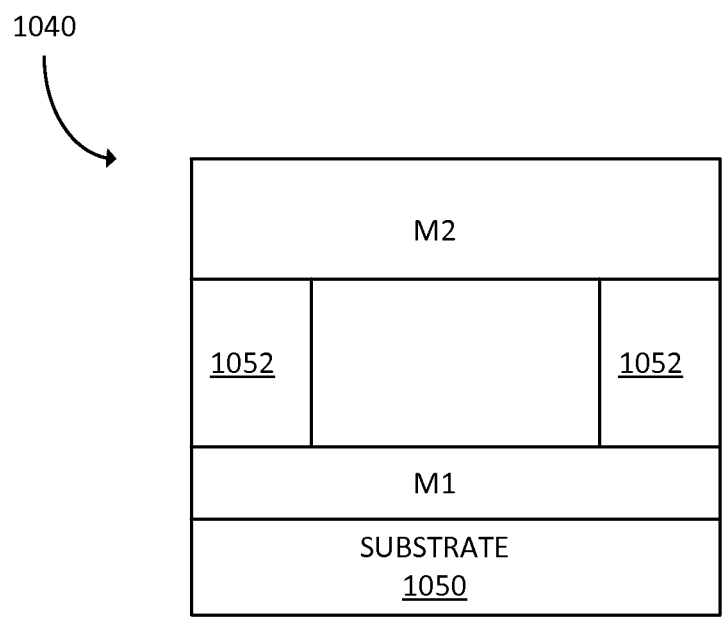
FIG. 10A is a side view of a vertical metal plate in accordance with some embodiments.

With reference to FIG. 10, an exemplary integrated capacitor structure 1000 can be a differential capacitor comprising a first interdigitated structure 1010 opposing a second interdigitated structure 1020 each electrically connected to a signal line (not shown). Digits 1011, 1021 of the respective structures complement and can, in some embodiments, mirror opposing digits on the other structure thereby forming a plurality of differential capacitor units 1005. Each of the digits 1011, 1021 and connecting portions thereof comprise vertical metal plates. Positioned in these differential capacitor units 1005 and hence between digits 1011, 1021 of the first and second interdigitated structures 1010, 1020 are interior vertical metal plates 1014 each electrically connected to a ground node in an exemplary switch described above. Of course, the interior vertical metal plates 1014 can possess any suitable geometry. Exemplary switches can be, but are not limited to, a MOSFET, a diode, a BJT, a PN transistor, an NP transistor, an NPN transistor, a PNP transistor, or other switching mechanism. It should be noted that the number of differential capacitor units 1005 in the illustrated structure is only exemplary as embodiments according to the present disclosure can include more or less than the three differential capacitor units 1005 depicted. The digits 1011, 1012 and interior metal plates 1014 can be insulated from adjacent vertical metal plates using an insulation material 1016 such as, but not limited to, interlayer dielectrics or other suitable insulators employed in semiconductor fabrication processes. The vertical metal plates can be formed on a semiconductor substrate 1050 and can be formed from several metal layers (e.g., M1 and M2 as shown in FIG. 10A) connected in parallel by vertical vias 1052, or otherwise, to thereby form a vertical metal wall or mesh 1040. In some embodiments of the present disclosure, an exemplary integrated capacitor structure 1000 can comprise a plurality of different switches for the respective units 1005. Further, any or all of the capacitor units 1005 can be independently tuned by a respective switch. Thus, an exemplary differential capacitor structure 1000 can provide a wide range of capacitance for various applications.

One of the broader forms of the present disclosure provide a capacitor structure having a semiconductor substrate and a matrix of capacitor units formed over the semiconductor substrate each capacitor unit. Any number of units, 2, 4, 6, 8, and so forth can be included in an exemplary matrix. The matrix includes an interior structure comprised of one or more vertical plates, each vertical plate of the interior structure formed from a plurality of conductive portions connected vertically to each other. Exemplary interior structures can be, but are not limited to, an H-shaped structure, an I-shaped structure, a vertical post, or combinations thereof. The matrix also includes an exterior structure comprised of one or more vertical plates, each vertical plate of the exterior structure formed from a plurality of conductive portions connected vertically to each other, the exterior structure substantially encompassing the interior structure. The exterior structure can be electrically connected to a signal line. In some embodiments, the exterior structures of adjacent capacitor units are electrically connected to each other. The matrix further includes insulative material separating the interior and exterior structures. The capacitor structure also provides a switching mechanism included in the capacitor structure to switch between ones of the plural capacitor units. In various embodiments, each interior structure within the matrix can be electrically connected to a ground node of the switching mechanism. In other embodiments, plural interior structures within the matrix can be connected to different ground nodes of the switching mechanism. Exemplary switching mechanisms can be, but are not limited to, MOSFETs, diodes, BJTs, a PN transistor, an NP transistor, an NPN transistor, a PNP transistor, or combinations thereof. In another embodiment of the present disclosure the capacitor structure can include one or more additional structures, each partially or completely encompassing the matrix of capacitor units. In certain embodiments, adjacent additional structures are alternately electrically connected to signal and ground nodes to thereby change capacitive characteristics of the capacitor structure. In a further embodiment of the present disclosure, the exterior structure further comprises a first set of one or more vertical plates substantially encompassing half of the interior structure, and a second set of one or more vertical plates substantially encompassing an opposing half of the interior structure, each vertical plate of the first and second sets formed from a plurality of conductive portions connected vertically to each other in the respective sets. In this embodiment, the first set is electrically connected to a first signal line, and the second set is electrically connected to a second signal line.

Other broad forms of the present disclosure provide a capacitor structure having a semiconductor substrate and a grid of capacitor elements formed over the semiconductor substrate each capacitor element having a first structure electrically connected to a signal line and a second structure electrically connected to a ground line of a switching mechanism included in the capacitor structure to switch between ones of the capacitor elements in the grid. Any number of elements, 2, 4, 6, 8, and so forth can be included in an exemplary grid. The capacitor structure also includes insulative material separating the first and second structures. In some embodiments, the first structure substantially encompasses one or more second structures. For example, exemplary second structures can be, but are not limited to, an H-shaped structure, an I-shaped structure, a vertical post, or combinations thereof. In additional embodiments, plural second structures within the grid are connected to different ground lines of the switching mechanism. Exemplary switching mechanisms can be, but are not limited to, MOSFETs, diodes, BJTs, a PN transistor, an NP transistor, an NPN transistor, a PNP transistor, or combinations thereof. Another embodiment of the present disclosure further comprises one or more additional structures, each partially or completely encompassing the grid of capacitor elements. One such embodiment includes adjacent additional structures that are alternately electrically connected to signal and ground lines to thereby change the capacitance of the capacitor structure. A further embodiment of the present disclosure provides a first structure having a first set of one or more vertical plates substantially encompassing half of a second structure and a second set of one or more vertical plates substantially encompassing an opposing half of the second structure, each vertical plate of the first and second sets formed from a plurality of conductive portions connected vertically to each other in the respective sets. In this embodiment, the first set is electrically connected to a first signal line, and the second set is electrically connected to a second signal line. In an additional embodiment of the present disclosure, the first structure is a first set of interdigital fingers electrically connected to each other and the second structure is a second set of interdigital fingers electrically connected to each other.

An additional embodiment of the present disclosure provides a method of forming an integrated capacitor structure comprising the steps of providing a semiconductor substrate and forming a grid of capacitor elements over the semiconductor substrate each capacitor element having a first structure electrically connected to a signal line and a second structure electrically connected to a ground line of a switching mechanism included in the capacitor structure to switch between ones of the capacitor elements in the grid. The method also comprises providing insulative material separating the first and second structures.

Embodiments of the present disclosure thus described provide higher Q values than conventional capacitor elements, provide for no local variation due to a lack of process variation within the same capacitor structure when switching, and provide tunable or compensable capacitances for a respective capacitor. Additionally, exemplary embodiments can provide varying parasitic capacitances for diodes when the biasing is changed, e.g., if the diode is forward biased then no parasitic capacitance is provided.

It can be emphasized that the above-described embodiments, particularly any "preferred" embodiments, are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art can better understand the detailed description that follows. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions and alterations herein without departing from the spirit and scope of the present disclosure.

As shown by the various configurations and embodiments illustrated in FIGS. 1-10, various switched capacitor structures have been described.

While preferred embodiments of the present disclosure have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A capacitor structure comprising:
   a semiconductor substrate;
   a matrix of capacitor units formed over the semiconductor substrate, comprising:
   an interior structure comprising a plurality of vertical plates, each vertical plate of the interior structure formed from a plurality of conductive portions connected by vertical vias to each other and each of the plurality of vertical plates is separated from each other,
   an exterior structure encompassing a majority portion of the interior structure, the exterior structure including:
      a first set of vertical plates encompassing half of the interior structure, wherein the first set is electrically connected to a first signal line, and
      a second set of vertical plates encompassing an opposing half of the interior structure, each vertical plate of the first and second sets formed from a plurality of conductive portions connected by vertical vias to each other in the respective sets, wherein the second set is electrically connected to a second signal line, and
   insulative material separating the interior and exterior structures; and
   a switching mechanism included in the capacitor structure to switch between ones of the matrix of capacitor units, wherein each of the plurality of vertical plates of the interior structure is electrically connected to a ground node of the switching mechanism.

2. The capacitor structure of claim 1 wherein the vertical plates of the first set of adjacent capacitor units are electrically and physically connected to each other and the vertical plates of the second set of adjacent capacitor units are electrically and physically connected to each other.

3. The capacitor structure of claim 1 wherein each of the plurality of vertical plates of the interior structure is an I-shaped structure.

4. The capacitor structure of claim 1 wherein the interior structure within the matrix of capacitor units is electrically connected to the ground node of the switching mechanism.

5. The capacitor structure of claim 1 wherein the switching mechanism is selected from the group consisting of metal-oxide-semiconductor field effect transistor (MOSFET), a diode, a bipolar junction transistor (BJT), a PN transistor, an NP transistor, an NPN transistor, a PNP transistor, or combinations thereof.

6. A capacitor structure comprising:
   a semiconductor substrate;
   a grid of capacitor elements formed over the semiconductor substrate, comprising:
   a first structure and a second structure, the second structure electrically connected to a ground line of a switching mechanism included in the capacitor structure to switch between ones of the capacitor elements in the grid, the first structure including:
      a first set of vertical plates encompassing half of a second structure, wherein the first set is electrically connected to a first signal line, and
      a second set of vertical plates encompassing an opposing half of the second structure, each vertical plate of the first and second sets formed from a plurality of conductive portions connected by vertical vias to each other in the respective sets, wherein the second set is electrically connected to a second signal line; and
   insulative material separating the first and second structures;
   wherein the second structure includes a plurality of vertical plates, each vertical plate of the second structure formed from a plurality of conductive portions connected by vertical vias to each other and each of the plurality of vertical plates is separated from each other.

7. The capacitor structure of claim 6 wherein the vertical plates of the first set of adjacent capacitor units are electrically and physically connected to each other and the vertical plates of the second set of adjacent capacitor units are electrically and physically connected to each other.

8. The capacitor structure of claim 6 wherein each of the plurality of vertical plates of the second structure is an I-shaped structure.

9. The capacitor structure of claim 6 wherein the switching mechanism is selected from the group consisting of metal-oxide-semiconductor field effect transistor (MOSFET), a diode, a bipolar junction transistor (BJT), a PN transistor, an NP transistor, an NPN transistor, a PNP transistor, or combinations thereof.

* * * * *